(12) United States Patent
Yu et al.

(10) Patent No.: US 8,134,174 B2
(45) Date of Patent: Mar. 13, 2012

(54) LIGHT-EMITTING DIODE

(75) Inventors: Kuohui Yu, Sinshih Township, Tainan County (TW); Chienchun Wang, Sinshih Township, Tainan County (TW); Changhsin Chu, Sinshih Township, Tainan County (TW); Menghsin Li, Sinshih Township, Tainan County (TW)

(73) Assignee: Chi Mei Lighting Technology Group., Sinshih Township, Tainan County (TW)

( * ) Notice: Subject to any disclaimer, the term of this patent is extended or adjusted under 35 U.S.C. 154(b) by 201 days.

(21) Appl. No.: 12/721,923

(22) Filed: Mar. 11, 2010

(65) Prior Publication Data
US 2011/0079805 A1 Apr. 7, 2011

(30) Foreign Application Priority Data
Oct. 2, 2009 (TW) ................ 98133600 A

(51) Int. Cl.
*H01L 33/00* (2010.01)
*H01L 33/06* (2010.01)

(52) U.S. Cl. ........... 257/99; 257/13; 257/79; 257/86; 257/91; 257/94; 257/98; 257/100; 257/594; 257/E33.005; 257/E33.061; 257/E33.062; 257/E33.073; 257/E25.028; 438/27; 438/28; 438/29; 438/456

(58) Field of Classification Search ......... 257/9, 11–14, 257/23, 37, 79, 86, 88, 90, 91, 94–100, 183, 257/200, 594, 684, 688, E33.001, E33.002, 257/E33.005–E33.007, E33.055–E33.059, 257/E33.061, E33.062, E33.066–E33.073, 257/E25.028; 438/26–27, 29–32, 38–43, 438/46–47
See application file for complete search history.

(56) References Cited

U.S. PATENT DOCUMENTS

| | | | |
|---|---|---|---|
| 6,033,927 A * | 3/2000 | Shibata et al. ........... | 438/33 |
| 6,088,376 A * | 7/2000 | O'Brien et al. ........ | 372/50.124 |
| 6,111,904 A * | 8/2000 | Takano ............... | 372/45.01 |
| 6,541,800 B2 * | 4/2003 | Barnett et al. ............ | 257/98 |
| 6,599,768 B1 * | 7/2003 | Chen ................. | 438/22 |
| 6,661,031 B2 * | 12/2003 | Takaoka .............. | 257/98 |
| 6,903,381 B2 * | 6/2005 | Lin et al. ............. | 257/99 |
| 6,956,322 B2 * | 10/2005 | Ikeda ................ | 313/498 |
| 7,138,660 B2 * | 11/2006 | Ota et al. ............. | 257/79 |
| 7,157,743 B2 * | 1/2007 | Kaneko ............... | 257/98 |
| 7,227,190 B2 * | 6/2007 | Yasukawa et al. ........ | 257/79 |
| 7,244,629 B2 * | 7/2007 | Ezaki et al. ............ | 438/39 |
| 7,329,942 B2 * | 2/2008 | Tsou et al. ............ | 257/594 |
| 7,436,000 B2 * | 10/2008 | Kim et al. ............. | 257/98 |
| 7,807,484 B2 * | 10/2010 | Wang et al. ............ | 438/29 |
| 8,022,427 B2 * | 9/2011 | Miyake et al. ........... | 257/98 |

(Continued)

*Primary Examiner* — Matthew Landau
*Assistant Examiner* — Maliheh Malek
(74) *Attorney, Agent, or Firm* — MH2 Technology Law Group, LLP

(57) ABSTRACT

A light-emitting diode and a method for manufacturing the same are described. The light-emitting diode includes a bonding substrate, a first conductivity type electrode, a bonding layer, an epitaxial structure, a second conductivity type electrode, a growth substrate and an encapsulant layer. The first conductivity type electrode and the bonding layer are respectively disposed on two surfaces of the bonding substrate. The epitaxial structure includes a first conductivity type semiconductor layer, an active layer and a second conductivity type semiconductor layer. A trench is set around the epitaxial structure and extends from the second conductivity type semiconductor layer to the first conductivity type semiconductor layer. The second conductivity type electrode is electrically connected to the second conductivity type semiconductor layer. The growth substrate is disposed on the epitaxial structure and includes a cavity exposing the epitaxial structure and the trench. The encapsulant layer is filled in the cavity.

20 Claims, 12 Drawing Sheets

U.S. PATENT DOCUMENTS

| | | | |
|---|---|---|---|
| 2002/0134987 A1* | 9/2002 | Takaoka | 257/98 |
| 2004/0104398 A1* | 6/2004 | Hon et al. | 257/98 |
| 2005/0130390 A1* | 6/2005 | Andrews et al. | 438/458 |
| 2006/0157717 A1* | 7/2006 | Nagai et al. | 257/81 |
| 2007/0096130 A1* | 5/2007 | Schiaffino et al. | 257/98 |
| 2008/0261341 A1* | 10/2008 | Zimmerman et al. | 438/33 |
| 2010/0041170 A1* | 2/2010 | Epler et al. | 438/26 |
| 2010/0090235 A1* | 4/2010 | Wang et al. | 257/98 |
| 2010/0148380 A1* | 6/2010 | Hayashi et al. | 257/793 |
| 2010/0193808 A1* | 8/2010 | Lee et al. | 257/88 |
| 2010/0207142 A1* | 8/2010 | Chen et al. | 257/98 |
| 2010/0207157 A1* | 8/2010 | Schiaffino et al. | 257/99 |
| 2010/0283075 A1* | 11/2010 | McKenzie et al. | 257/98 |
| 2010/0301373 A1* | 12/2010 | Urano et al. | 257/98 |
| 2010/0314633 A1* | 12/2010 | Donofrio et al. | 257/88 |
| 2011/0012164 A1* | 1/2011 | Kim | 257/99 |
| 2011/0045620 A1* | 2/2011 | Kang et al. | 438/29 |
| 2011/0057223 A1* | 3/2011 | Hwang | 257/98 |
| 2011/0062476 A1* | 3/2011 | Tobise | 257/98 |
| 2011/0133221 A1* | 6/2011 | Choi et al. | 257/88 |
| 2011/0140076 A1* | 6/2011 | Song | 257/13 |
| 2011/0143467 A1* | 6/2011 | Xiong et al. | 438/29 |
| 2011/0204395 A1* | 8/2011 | Hong et al. | 257/94 |

* cited by examiner

LIGHT-EMITTING DIODE

RELATED APPLICATIONS

This application claims priority from Taiwan Patent Application Ser. No. 098133600, filed on Oct. 2, 2009, which is hereby incorporated by reference in its entirety.

FIELD OF THE INVENTION

The invention relates generally to a light-emitting device and, more particularly, to a light-emitting diode and a method for manufacturing the same.

BACKGROUND OF THE INVENTION

Currently, a conventional packaging process for a light-emitting diode mounts a light-emitting diode chip onto a package frame that can provide a protection function, and forms an encapsulant layer to cover and protect the light-emitting diode chip. Other than providing the light-emitting diode chip with a superior protection, the package frame also has to transmit electrical signals from an external circuit to the light-emitting diode chip for the operation of the light-emitting diode chip.

However, in order to achieve this with a conventional packaging process, the volume of the packaged structure must be greatly increased which, in turn, increases the manufacturing cost. Therefore, a technique, which can reduce the volume of the light-emitting diode package and can decrease the manufacturing cost, is desired.

SUMMARY OF THE INVENTION

Therefore, one aspect of the present teachings is to provide a light-emitting diode and a method for manufacturing the same, in which a growth substrate may be used to replace a package frame, so that the volume of a packaged structure of the light-emitting diode can be reduced and the manufacturing cost can be decreased.

Another aspect of the present teachings is to provide a light-emitting diode and a method for manufacturing the same, in which the conduction locations of two electrodes of the light-emitting diode with horizontal electrodes type can be adjusted to the same side of a package structure, so that a wire bonding step can be omitted, and the light-emitting diode can be directly disposed on a circuit board. Therefore, the light-extracting area of the light-emitting diode device can be increased, and the problem of poor yield of wire bonding in the conventional design can be avoided.

Still another aspect of the present teachings is to provide a light-emitting diode and a method for manufacturing the same, which can use a substrate replacement technique to enhance the heat-dissipating efficiency, so that the life and the stability of the photoelectric quality of the light-emitting diode can be increased.

According to the aforementioned aspects, the present teachings provide a light-emitting diode. The light-emitting diode includes a bonding substrate, a first conductivity type electrode, a bonding layer, an epitaxial structure, a second conductivity type electrode, a growth substrate and an encapsulant layer. The first conductivity type and the second conductivity type have different conductivity types. The bonding substrate includes a first surface and a second surface on opposite sides. The first conductivity type electrode is disposed on the second surface of the bonding substrate. The bonding layer is disposed on the first surface of the bonding substrate. The epitaxial structure includes a first conductivity type semiconductor layer, an active layer and a second conductivity type semiconductor layer stacked on the bonding layer in sequence, wherein a trench is set around the epitaxial structure and extends from the second conductivity type semiconductor layer to the first conductivity type semiconductor layer. The second conductivity type electrode is electrically connected to the second conductivity type semiconductor layer. The growth substrate is disposed on the epitaxial structure, wherein the growth substrate includes a cavity exposing a portion of the epitaxial structure and the trench. The encapsulant layer is filled in the cavity.

According to one embodiment of the present teachings, the second conductivity type electrode is disposed on the second conductivity type semiconductor layer, and the cavity exposes the second conductivity type electrode.

According to another embodiment of the present teachings, the light-emitting diode further includes a contact hole, wherein the contact hole extends from the first conductivity type semiconductor layer to the second conductivity type semiconductor layer, and the contact hole exposes a portion of the second conductivity type semiconductor layer.

According to the aforementioned aspects, the present teachings further provide a method for manufacturing a light-emitting diode including the following steps. A growth substrate is provided. An epitaxial structure is formed on the growth substrate, wherein the epitaxial structure includes a second conductivity type semiconductor layer, an active layer and a first conductivity type semiconductor layer stacked on the growth substrate in sequence. The first conductivity type semiconductor layer and the second conductivity type semiconductor layer have different conductivity types. A bonding layer is used to bond the first conductivity type semiconductor layer and a first surface of a bonding substrate, wherein the bonding substrate further includes a second surface opposite to the first surface. A cavity is formed in the growth substrate, wherein the cavity exposes a portion of the epitaxial structure. A trench is formed in the epitaxial structure, wherein the trench is set around the epitaxial structure and extends from the second conductivity type semiconductor layer to the first conductivity type semiconductor layer. A second conductivity type electrode is formed to electrically connect the second conductivity type semiconductor layer. A first conductivity type electrode is formed on the second surface of the bonding substrate. An encapsulant layer is formed to fill into the cavity.

According to one embodiment of the present teachings, the step of forming the second conductivity type electrode further includes disposing the second conductivity type electrode on the exposed portion of the second conductivity type semiconductor layer.

According to another embodiment of the present teachings, before the step of forming the second conductivity type electrode, the method for manufacturing a light-emitting diode further includes forming a contact layer extending from the first conductivity type semiconductor layer to the second conductivity type semiconductor layer, wherein the contact hole exposes a portion of the second conductivity type semiconductor layer. In addition, the second conductivity type electrode is formed on the exposed portion of the second conductivity type semiconductor layer.

According to the aforementioned embodiments, by applying the present disclosure, the volume of the package structure of the light-emitting diode can be decreased, the manufacturing cost can be decreased, the light-extracting area of the light-emitting diode device can be increased, the process yield can be enhanced, and the life and the stability of the photoelectric quality of the light-emitting diode can be increased.

BRIEF DESCRIPTION OF THE DRAWINGS

The foregoing aspects and many of the attendant advantages of this invention are more readily appreciated as the same become better understood by reference to the following detailed description, when taken in conjunction with the accompanying drawings, wherein.

DETAILED DESCRIPTION OF THE EXEMPLARY EMBODIMENTS

Figure 1A:
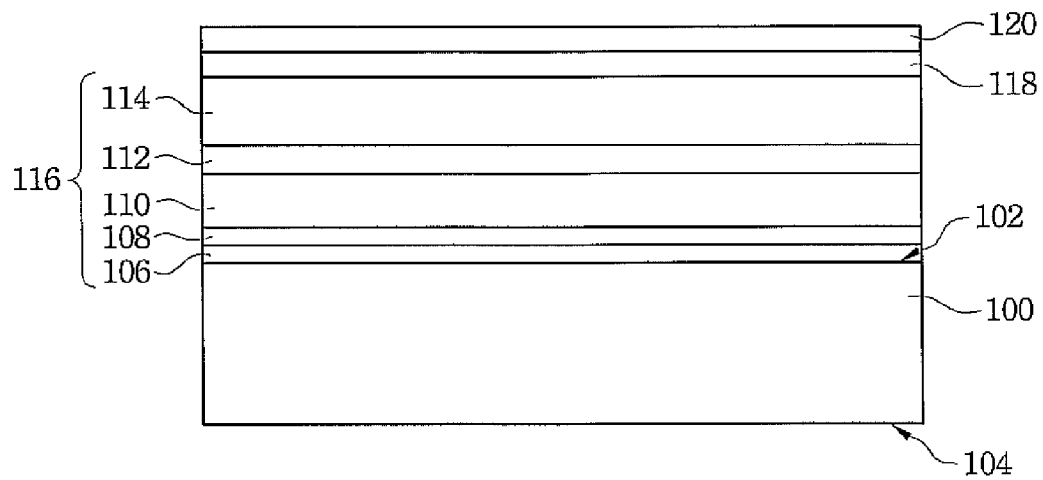
FIGS. 1A through 1F are schematic flow diagrams showing a process for manufacturing a light-emitting diode in accordance with an embodiment of the present teachings.

FIGS. 1A through 1F are schematic flow diagrams showing an exemplary process for manufacturing a light-emitting diode in accordance with an embodiment of the present teachings. In the present embodiment for manufacturing a light-emitting diode, a growth substrate 100 is firstly provided. The growth substrate 100 includes surfaces 102 and 104 on opposite sides. The material of the growth substrate 100 may include, but is not limited to, $Al_2O_3$, SiC or GaAs.

Then, an epitaxial structure 116 is formed on the surface 102 of the growth substrate 100 by, for example, an epitaxial growth method. In one embodiment, the epitaxial structure 116 may include a second conductivity type semiconductor layer 110, an active layer 112 and a first conductivity type semiconductor layer 114 stacked on the surface 102 of the growth substrate 100 in sequence. The first conductivity type semiconductor layer 114 and the second conductivity type semiconductor layer 110 have different conductivity types. For example, the first conductivity type semiconductor layer 114 and the second conductivity type semiconductor layer 110 can be n-type and p-type, respectively. In the embodiment illustrated in FIG. 1A, the epitaxial structure 116 further includes a buffer layer 106 and an undoped semiconductor layer 108. The buffer layer 106 is firstly formed on the surface 102 of the growth substrate 100, the undoped semiconductor layer 108 is next grown on the buffer layer 106, and the second conductivity type semiconductor layer 110, the active layer 112 and the first conductivity type semiconductor layer 114 are then grown in sequence. The material of the epitaxial structure 116 may include, but is not limited to, an InAlGaN-based material or an InAlGaP-based material.

In one embodiment, a first conductivity type contact layer 118 may be selectively formed to cover the first conductivity type semiconductor layer 114 to enhance the electricity quality of the device. An ohmic contact may be formed between the first conductivity type contact layer 118 and the first conductivity type semiconductor layer 114. The first conductivity type contact layer 118 may be a single-layered structure or a multi-layered structure, such as a Ni/Au structure, a Ni/Ag structure, an ITO layer, a ZnO layer, a GZO layer, an AZO layer or an $InO_2$ layer. In addition, such as shown in FIG. 1A, according to the product requirement, a reflective layer 120 may be selectively formed to cover the first conductivity type contact layer 118 to increase the brightness of the device. The material of the reflective layer 120 may include, for example, a metal layer of high reflectivity or a distributed Bragg reflector (DBR). In one embodiment, the material of the reflective layer 120 may include Al, Ag, Pt, or a combination thereof.

Figure 1B:
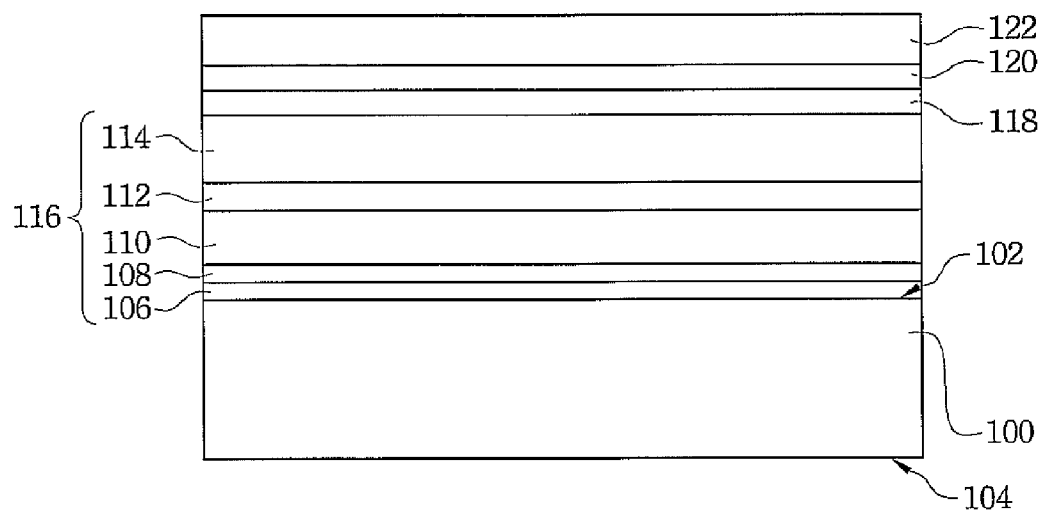
Figure 1C:
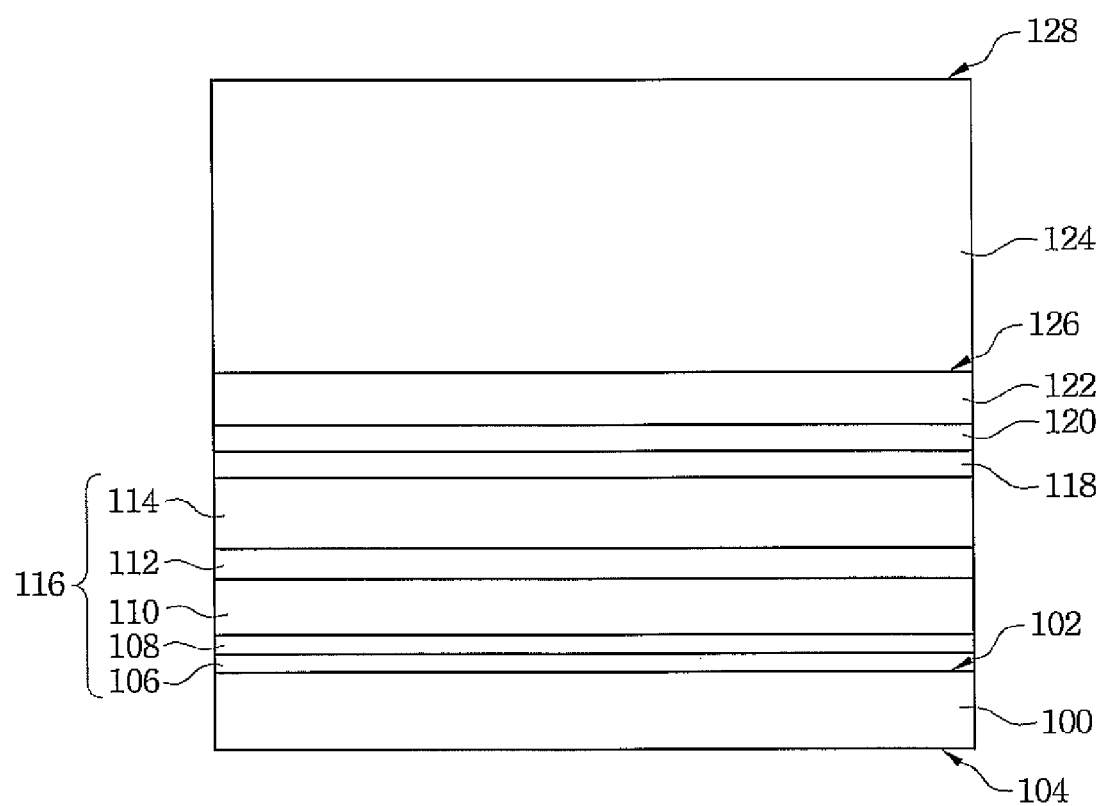

Then, as shown in FIG. 1B, a bonding layer 122 may be formed on the reflective layer 120. The material of the bonding layer 122 may be, for example, a metal. Next, a bonding substrate 124 is provided, wherein the bonding substrate 124 includes opposite surfaces 126 and 128. The material of the bonding substrate 124 may be a material having high electrical conductivity and/or large thermal conductivity. In one embodiment, the material of the bonding substrate 124 may include, for example, Si, Al, Cu, Mo, Ni, CuW, or a combination thereof. The reflective layer 120 is bonded to the surface 126 of the bonding substrate 124 by using the bonding layer 122 to bond the first conductivity type semiconductor layer 114 of the epitaxial structure 116 with the bonding substrate 124, such as shown in FIG. 1C. In another embodiment, the bonding layer 122 may be firstly formed on the surface 126 of the bonding substrate 124, and the bonding layer 122 is then used to bond the epitaxial structure 116 and the bonding substrate 124.

Then, a portion of the growth substrate 100 is removed by, for example, a dry etching method or a wet etching method to form a cavity 130 in the growth substrate 100 to make the growth substrate 100 a cavity structure including a sidewall 134. The cavity 130 exposes a large portion of the epitaxial structure 116. In one embodiment, a height 142 of the growth substrate 100 may be between about 0.5 μm and about 400 μm, and a thickness 144 of the sidewall 134 may be between about 1 μm and about 200 μm, although other heights and thicknesses can be included according to various embodiments. Furthermore, an included angle θ between the sidewall 134 and the epitaxial structure 116 may be between about 90 degrees and about 180 degrees to reflect the light toward the outer of the device. The shape of a front view of the cavity 130 may be a rectangle, a circle, an ellipse, a square or a rhombus, for example.

Figure 1D:
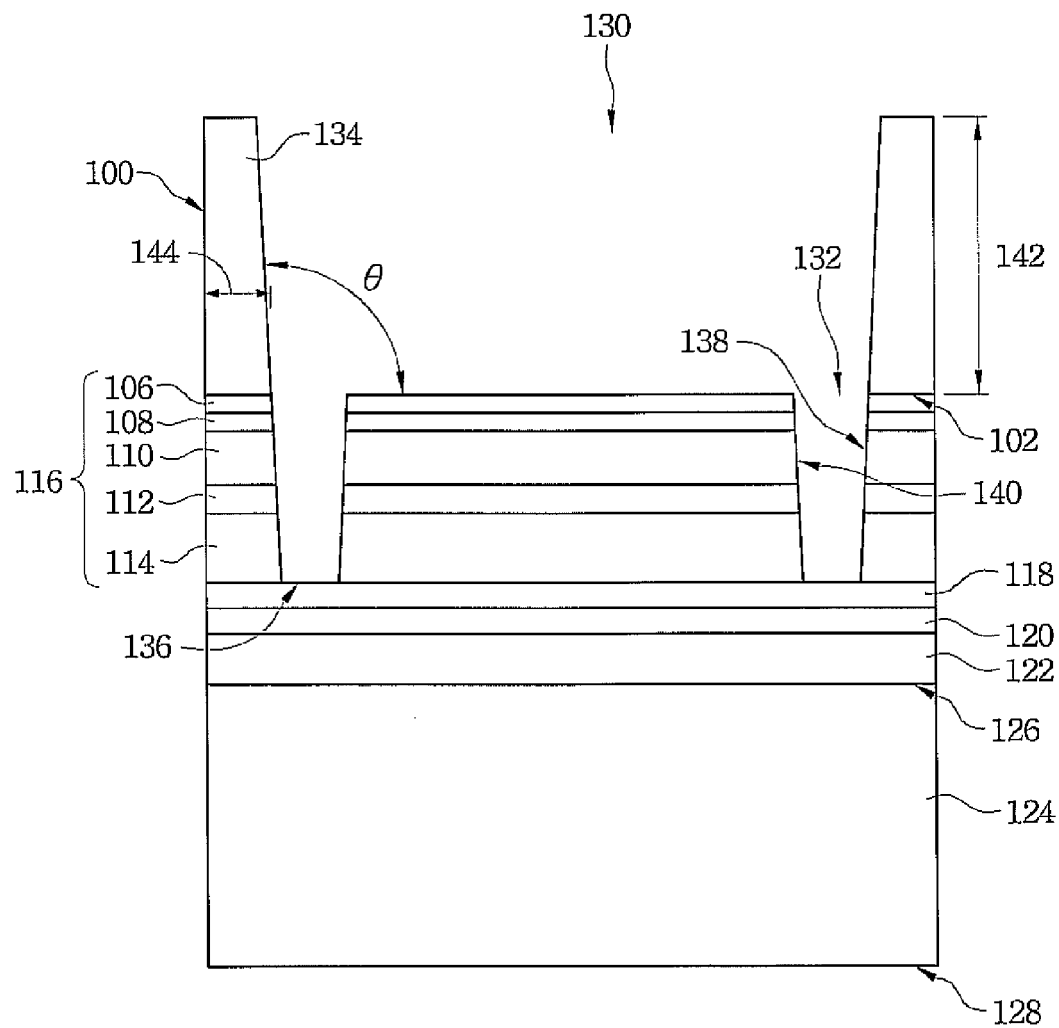

Subsequently, a portion of the epitaxial structure 116 is removed by an etching method to form a trench 132 in the epitaxial structure 116. The trench 132 is set around the epitaxial structure 116 to form a ring shape. In addition, such as shown in FIG. 1D, the trench 132 extends from the buffer layer 106 to the first conductivity type semiconductor layer 114 through the second conductivity type semiconductor layer 110. The trench 132 includes side surfaces 138 and 140 and a bottom surface 136, wherein the side surface 138 is connected to an inner side of the sidewall 134.

Figure 1E:
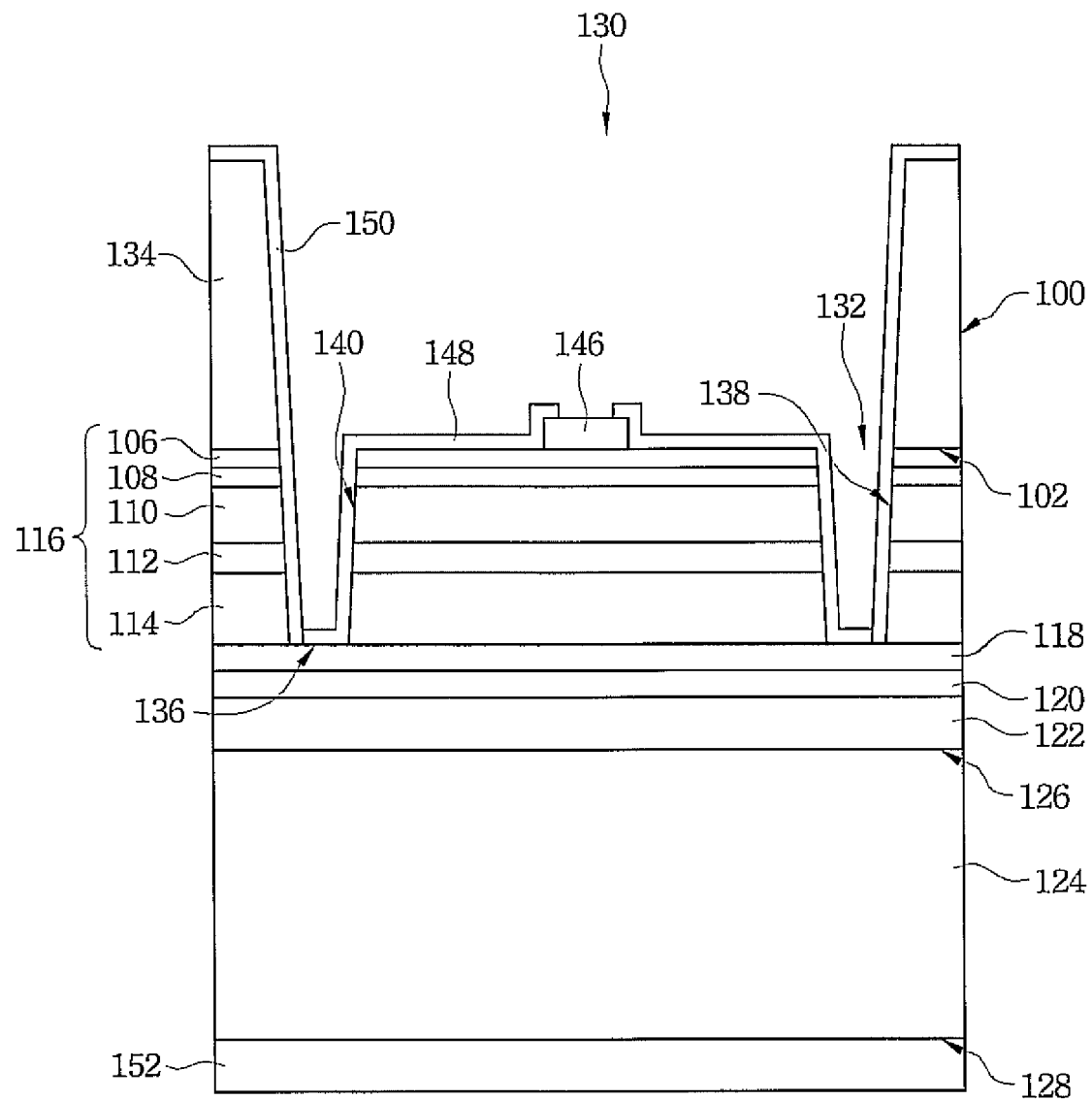

Then, such as shown in FIG. 1E, a second conductivity type electrode 146 is formed on the epitaxial structure 116 exposed by the cavity 130 to make the second conductivity type electrode 146 directly or indirectly connected with the second conductivity type semiconductor layer 110. A first conductivity type electrode 152 is formed to cover the surface 128 of the bonding substrate 124. In one embodiment, the first conductivity type electrode 152 may include a eutectic metal or a noneutectic metal. The eutectic metal may include AuSn, AgSn, AgSnCu, AuSnCu or AuBe. The noneutectic metal may include Au, Pt, Cr, Ti, Ni or Al.

Next, a protection layer 148 may be selectively formed to cover a portion of the second conductivity type electrode 146, the exposed portion of the epitaxial structure 116, and the side surface 140 and the bottom surface 136 of the trench 132 to prevent a short circuit when the device is operated. The material of the protection layer 148 may include, but is not limited to, $SiO_2$, $SiN_x$, spin-on glass (SOG), $TiO_2$ or $Al_2O_3$. Next, a reflective layer 150 is formed to cover the sidewall 134 and the side surface 138 of the trench 132 to reflect the light emitted by the device outwardly. The material of the reflective layer 150 may include a metal layer of high reflectivity or a distributed Bragg reflector (DBR). In one embodiment, the material of the reflective layer 150 may include Al, Ag or Pt.

Figure 1F:
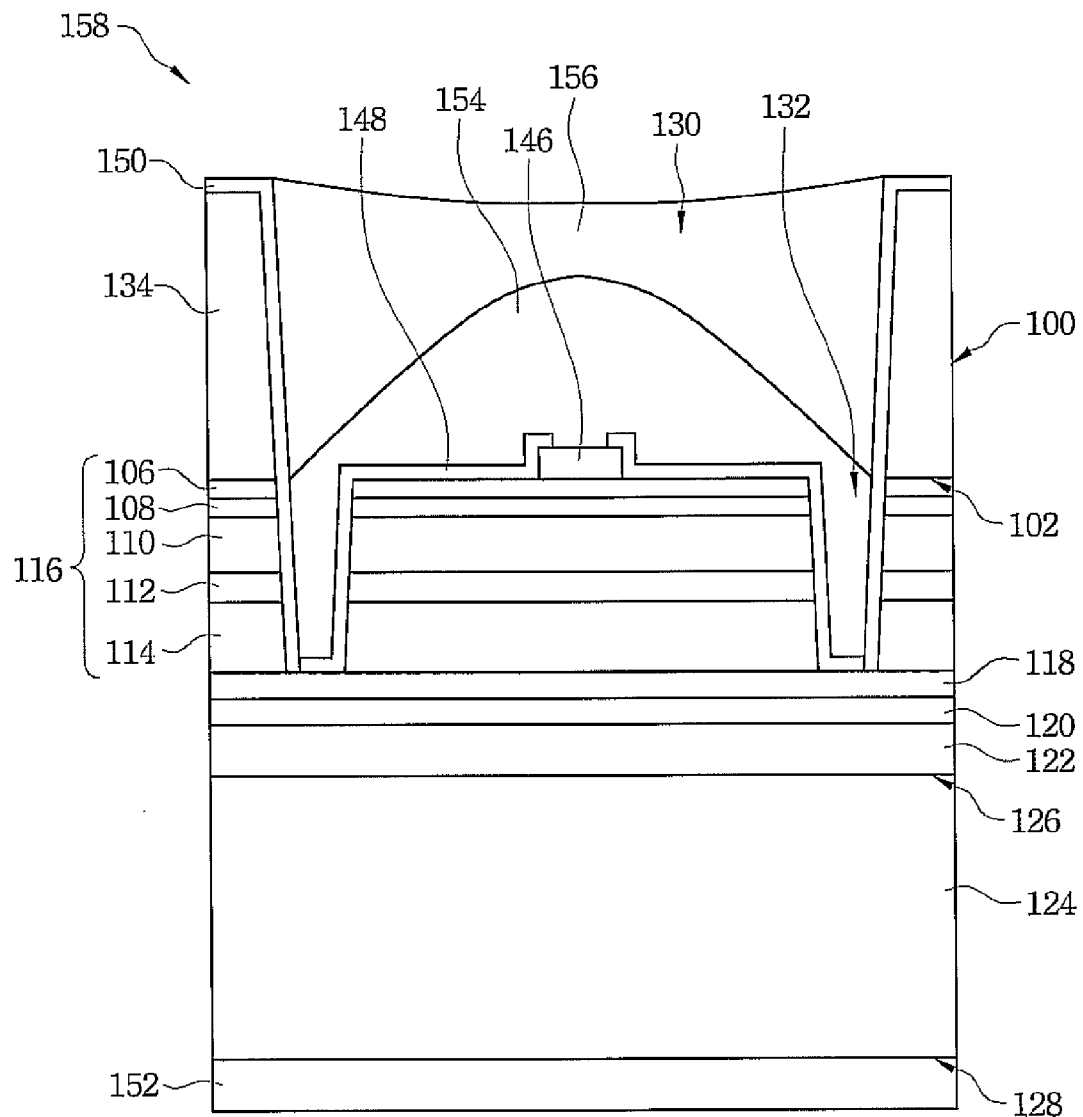

Next, such as shown in FIG. 1F, an optical material layer 154, such as a spectrum-converted material layer or a light-scattering material layer, may be selectively formed to cover the exposed portion of the epitaxial structure 116 in the cavity 130. When the optical material layer 154 is a spectrum-converted material layer, such as a fluorescent powder layer, the optical material layer 154 can change the bandwidth of the illuminant spectrum of the device. When the optical material layer 154 is a light-scattering material layer, the optical material layer 154 can enhance the light-extracting efficiency of the device. Subsequently, the encapsulant layer 156 is formed to fill into the cavity 130 to protect the epitaxial structure 116 and to complete the manufacturing of a light-emitting diode 158.

Figure 2A:
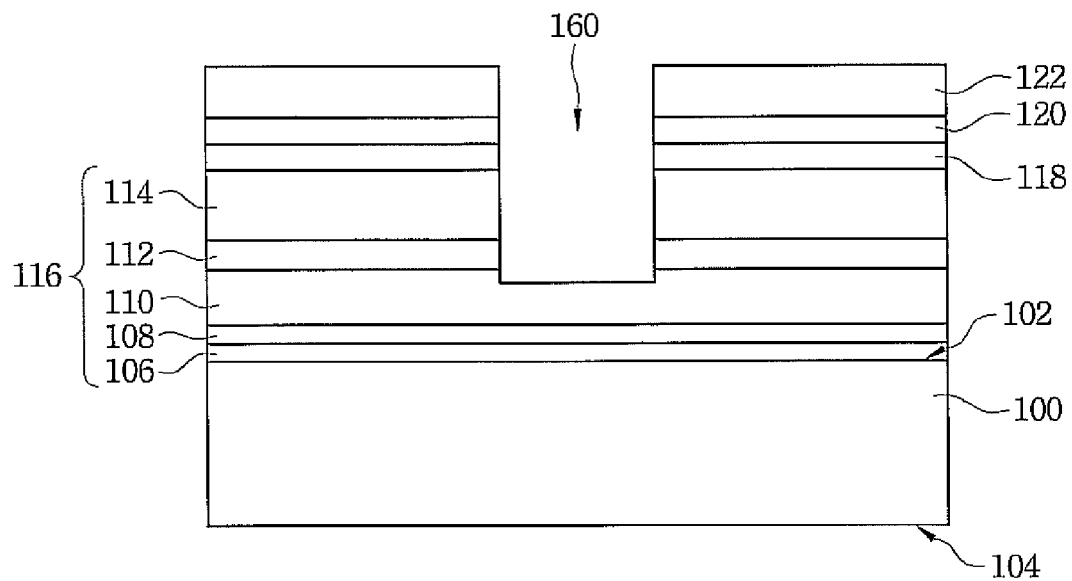
FIGS. 2A through 2F are schematic flow diagrams showing a process for manufacturing a light-emitting diode in accordance with another embodiment of the present teachings.

FIGS. 2A through 2F are schematic flow diagrams showing an exemplary process for manufacturing a light-emitting diode in accordance with another embodiment of the present teachings. In the present embodiment, a structure such as shown in FIG. 1B is firstly formed. Then, a definition step is performed by, for example, a photolithography and etching method to remove a portion of the bonding layer 122, a portion of the reflective layer 120, a portion of the first conductivity type contact layer 118, a portion of the first conductivity type semiconductor layer 114, a portion of the active layer 112 and a portion of the second conductivity type semiconductor layer 110 to form a first contact hole 160 extending from the bonding layer 122 to the second conductivity type semiconductor layer 110 through the first conductivity type semiconductor layer 114, such as shown in FIG. 2A. The first contact hole 160 exposes a portion of the second conductivity type semiconductor layer 110.

Figure 2B:
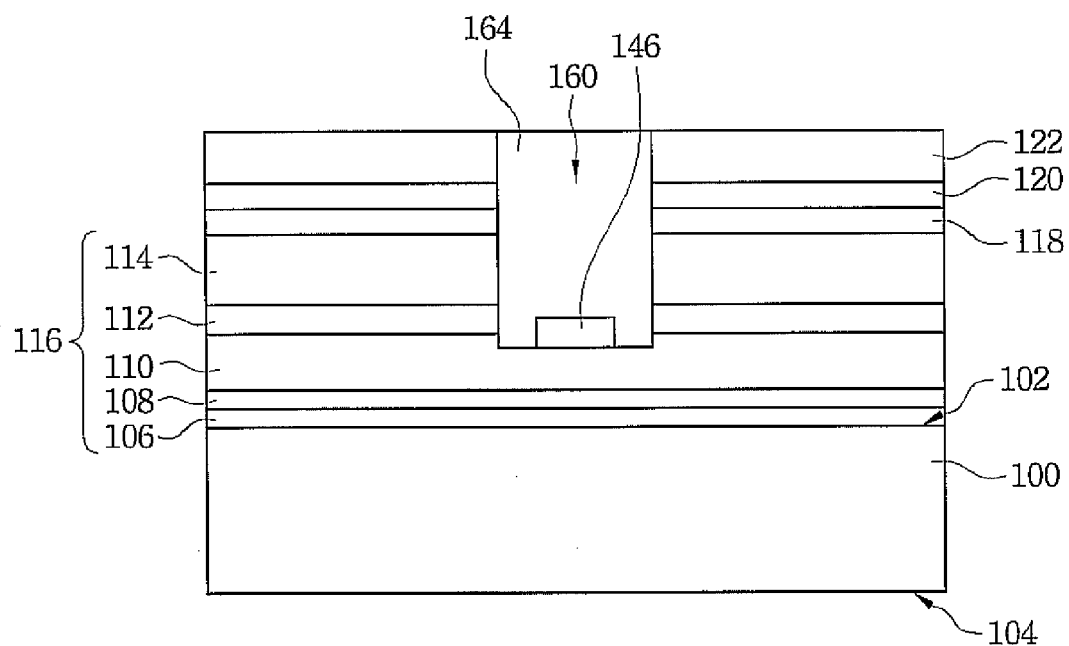

Next, a second conductivity type electrode 146 is formed on the exposed portion of the second conductivity type semiconductor layer 110. As shown in FIG. 2B, an isolation layer 164 is formed to fill the first contact hole 160 to protect the second conductivity type electrode 146 during the following processes.

Figure 2C:
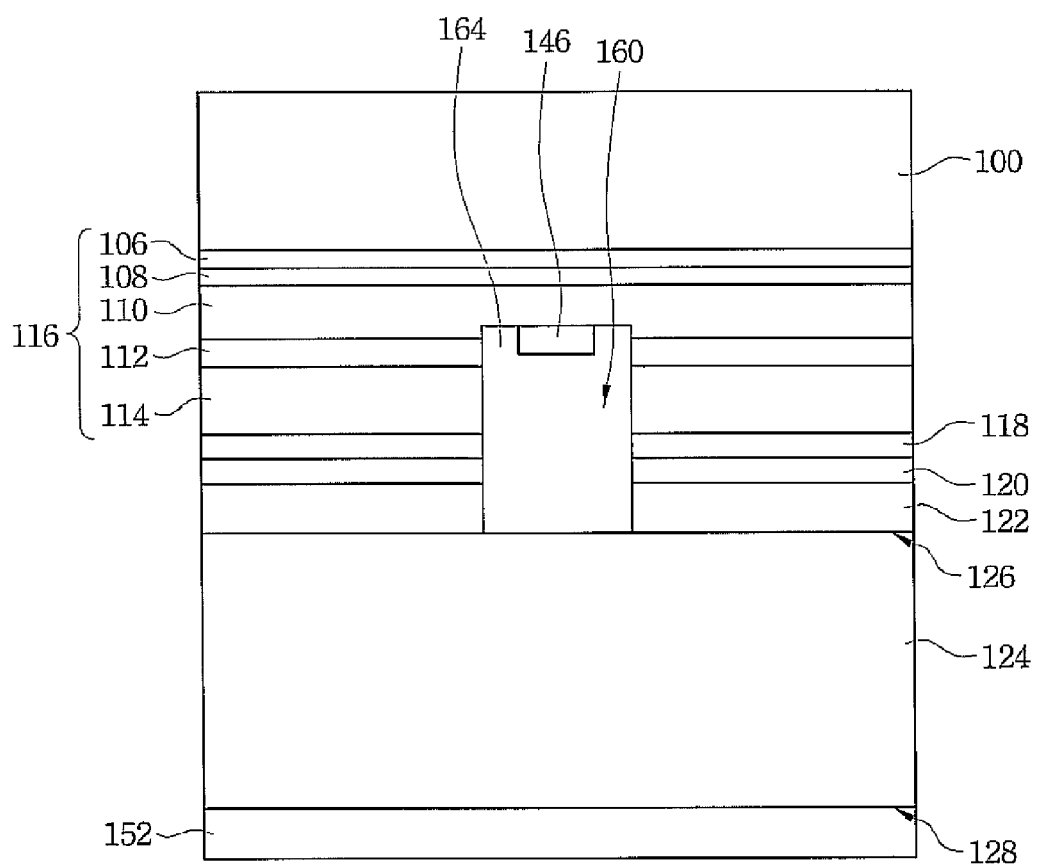

Then, a bonding substrate 124 is provided. The reflective layer 120 on the epitaxial structure 116 is bonded to the surface 126 of the bonding substrate 124 by using the bonding layer 122. Next, a portion of the bonding substrate 124 may be selectively removed to decrease the thickness of the bonding substrate 124 according to the product requirement. Subsequently, such as shown in FIG. 2C, a first conductivity type electrode 152 is formed on the surface 128 of the bonding substrate 124.

Next, a definition step is performed on the first conductivity type electrode 152 and the bonding substrate 124 by, for example, a photolithography and etching method to form a second contact hole 166 in the first conductivity type electrode 152 and the bonding substrate 124. Then, the isolation layer 164 is removed to open the first contact hole 160. The second contact hole 166 is connected with the first contact hole 160 to form a contact hole 168. Therefore, the contact hole 168 extends from the first conductivity type electrode 152 to the second conductivity type semiconductor layer 110, and the contact hole 168 exposes a portion of the second conductivity type semiconductor layer 110. The contact hole 168 includes a bottom surface 170 and a side surface 172. In one embodiment, the diameter of the contact hole 168 may be greater than or equal to about 1 μm and less than or equal to about 100 μm, for example. In addition, the depth of the contact hole 168 may be between about 10 μm and about 400 μm, for example.

In another embodiment, a portion of the second contact hole 166 may be firstly formed in the surface 126 of the bonding substrate 124, and after the bonding substrate 124 is thinned, the portion of the second contact hole 166 can be opened. Therefore, it is unnecessary to etch the bonding substrate 124.

Figure 2D:
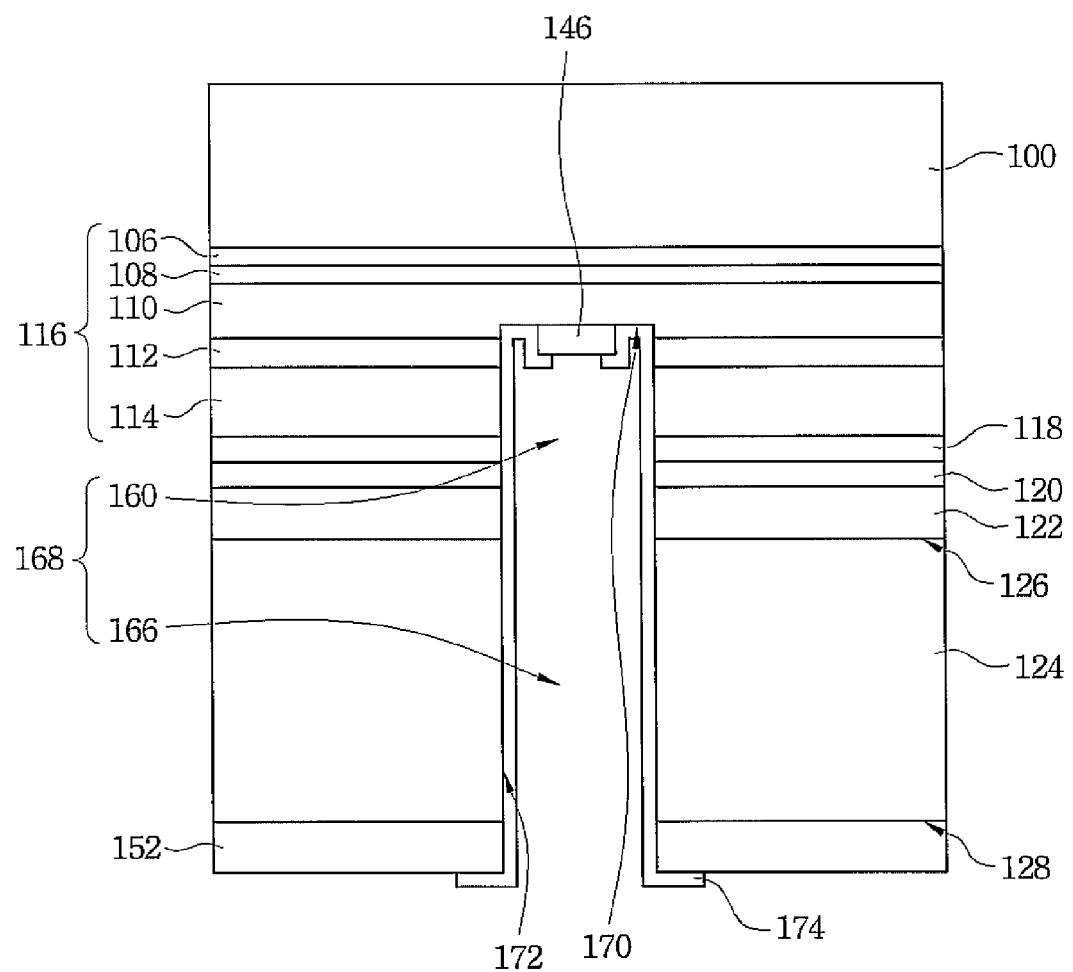

Then, a second conductivity type electrode 146 is formed on the exposed portion of the second conductivity type semiconductor layer 110. The second conductivity type electrode 146 is only located on a portion of the bottom surface 170 of the contact hole 168. Next, such as shown in FIG. 2D, an insulation layer 174 is formed to cover a portion of the second conductivity type electrode 146 and the exposed bottom surface 170 and the exposed side surface 172 of the contact hole 168, to electrically insulate a second conductivity type metal electrode layer 162 (referring to FIG. 2F) formed subsequently and the side surface 172 of the contact hole 168. The insulation layer 174 may further extend to the first conductivity type electrode 152 near an opening of the contact hole 168.

Figure 2E:
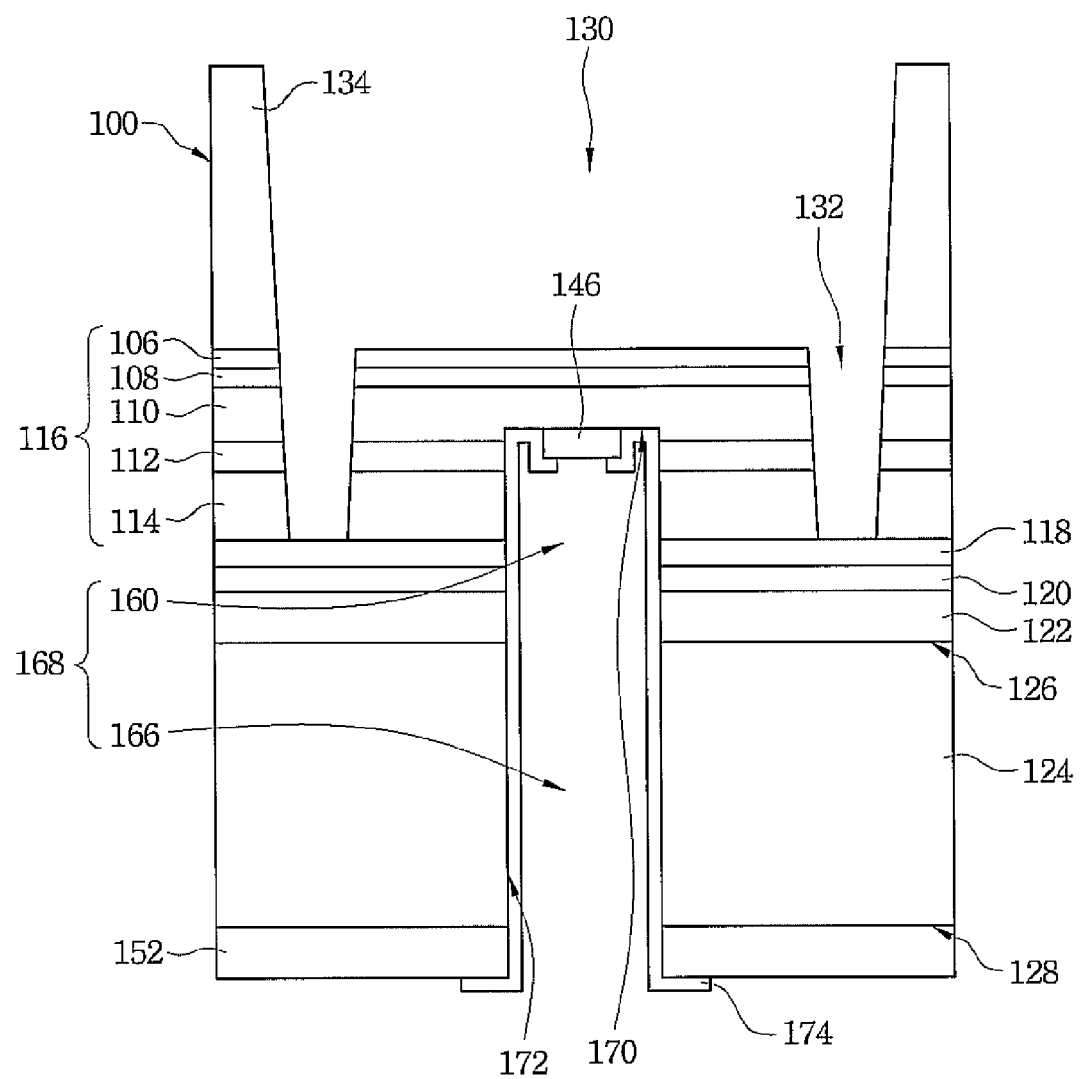

Then, a portion of the growth substrate 100 is removed by, for example, a dry etching method or a wet etching method to form a cavity 130 in the growth substrate 100 to make the growth substrate 100 a cavity structure including a sidewall 134. The cavity 130 exposes a larger portion of the epitaxial structure 116. Such as shown in FIG. 2E, a portion of the epitaxial structure 116 is removed by an etching method to form a trench 132 in the epitaxial structure 116. The trench 132 is set around the epitaxial structure 116 to form a ring shape, and the trench 132 extends from the buffer layer 106 to the first conductivity type semiconductor layer 114 through the second conductivity type semiconductor layer 110. A side surface 138 of the trench 132 is connected to an inner side of the sidewall 134.

In the present embodiment, the formation sequence of the cavity 130 and the contact hole 168 can be changed according to the process requirements, i.e. the contact hole 168 may be formed after the formation of the cavity 130.

Then, the second conductivity type metal electrode layer 162 may be formed to fill up the contact hole 168. The second conductivity type metal electrode layer 162 directly contacts the second conductivity type electrode 146 so that an electrical connection with the second conductivity type electrode 146 can be formed. In addition, a protection layer 148 may be selectively formed to cover the exposed portion of the epitaxial structure 116, and the side surface 140 and the bottom surface 136 of the trench 132 to prevent a short circuit from being occurred when the device is operated. Next, a reflective layer 150 is formed to cover the sidewall 134 and the side surface 138 of the trench 132 to reflect the light emitted by the device outwardly.

Figure 2F:
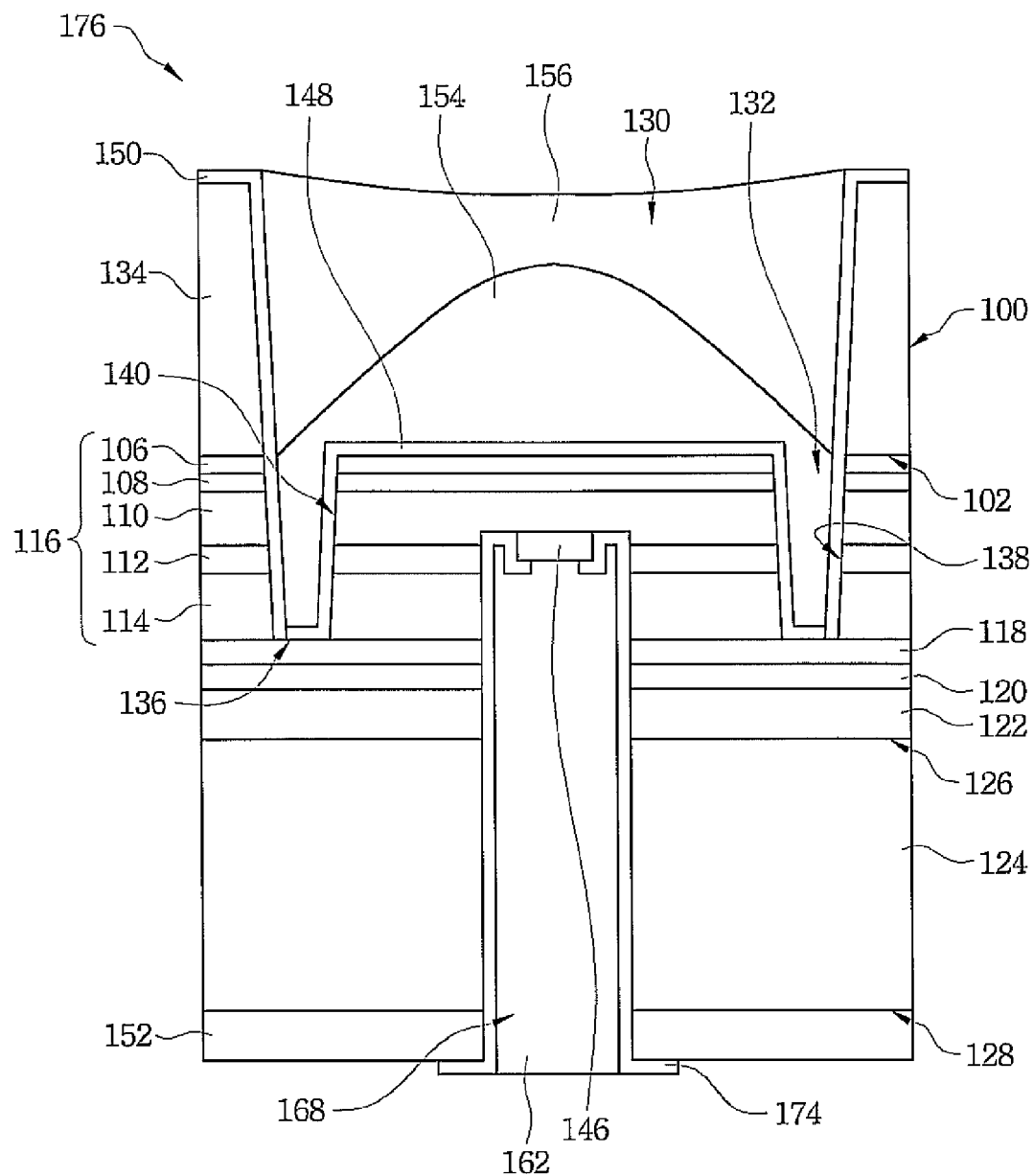

Then, an optical material layer 154, such as a spectrum-converted material layer or a light-scattering material layer, may be selectively formed to cover the exposed portion of the epitaxial structure 116 in the cavity 130. Subsequently, such as shown in FIG. 2F, an encapsulant layer 156 is formed to fill the cavity 130 to protect the epitaxial structure 116 and to complete the manufacturing of a light-emitting diode 176.

Figure 3A:
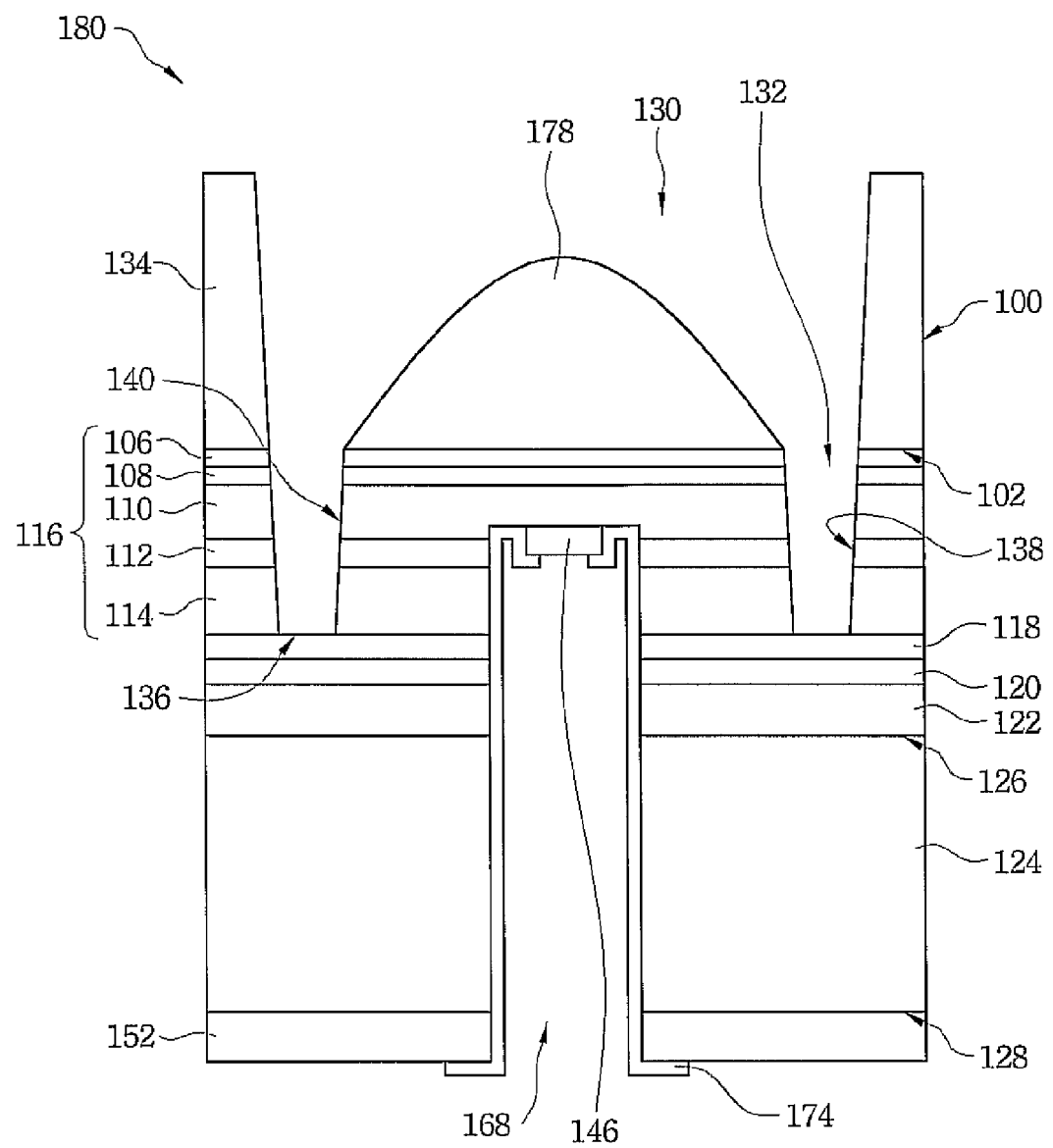
FIGS. 3A and 3B are schematic flow diagrams showing a process for manufacturing a light-emitting diode in accordance with still another embodiment of the present teachings.
Figure 3B:
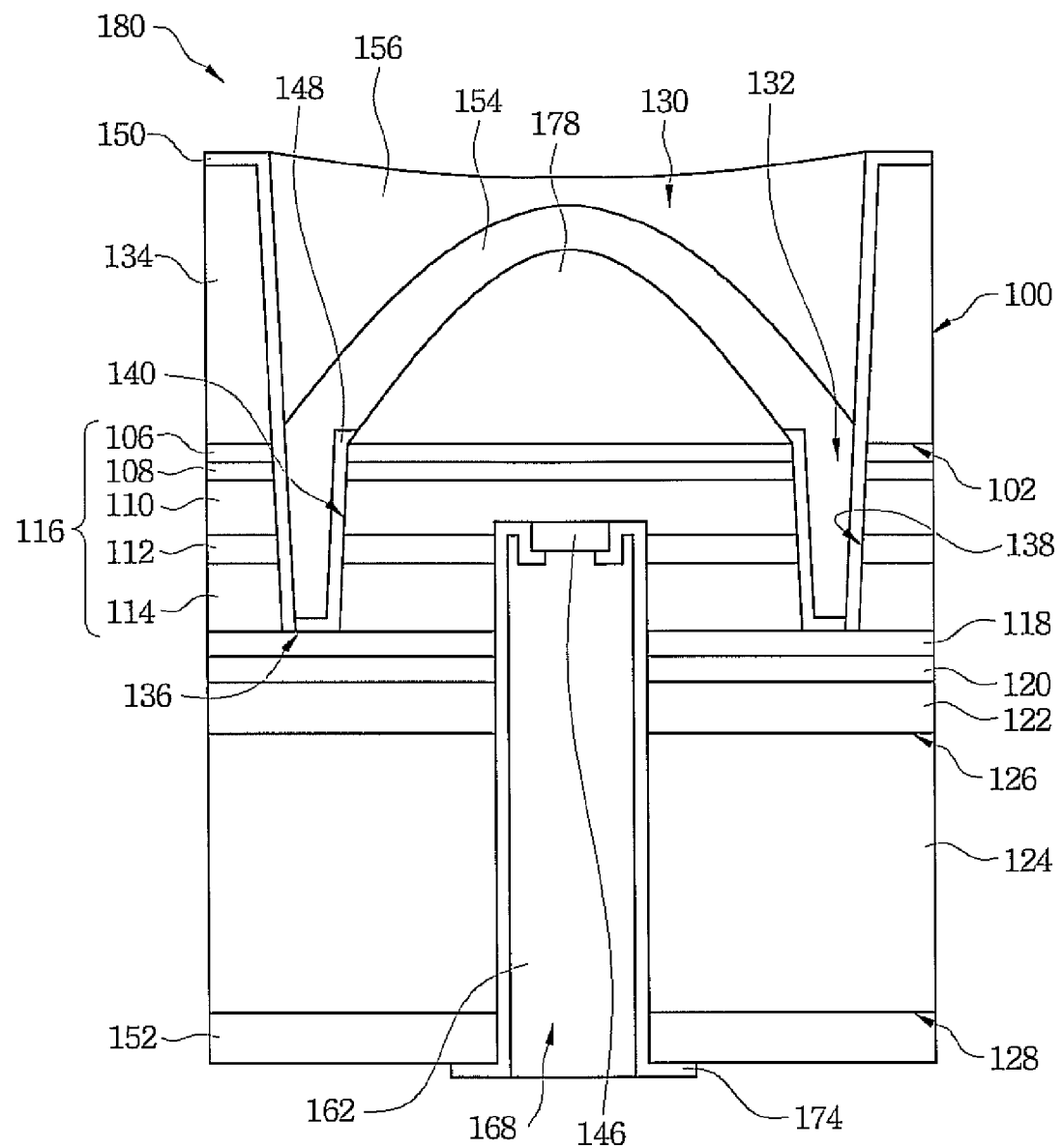

FIGS. 3A and 3B are schematic flow diagrams showing an exemplary process for manufacturing a light-emitting diode in accordance with another embodiment of the present teachings. In the present embodiment, a structure such as shown in FIG. 2D is firstly formed. A portion of the growth substrate 100 is removed by, for example, an etching method to form a cavity 130 in the growth substrate 100. In the formation of the cavity 130, the growth substrate 100 is shaped into a cavity structure including an optical structure 178 and a sidewall 134 by controlling the parameters of the etching process as known to one of ordinary skill in the art. The optical structure 178 may be located on a central region of the epitaxial structure 116. The shape of the lateral view of the optical structure 178 may be a rectangle, a cone, a pyramid or a semi-ellipsoid, for example. In another embodiment, the shape of the lateral view of the optical structure 178 may be a multi-circular structure, such as a convex circular structure, a wavy structure or a triangular circular structure. The optical structure 178 may be a regular arranged structure or an irregular arranged structure, such as a Fresnel lens, an optical grating or photonic crystals. The height of the optical structure 178 may be between about 0.5 μm and about 400 μm, for example.

As shown in FIG. 3A, a portion of the epitaxial structure 116 is removed by an etching method to form a trench 132 in the epitaxial structure 116. The trench 132 is set around the epitaxial structure 116 to form a ring shape, and the trench 132 extends from the buffer layer 106 to the first conductivity type semiconductor layer 114 through the second conductivity type semiconductor layer 110. A side surface 138 of the trench 132 is connected to an inner side of the sidewall 134.

Then, a second conductivity type metal electrode layer 162 may be formed to fill up the contact hole 168. The second conductivity type metal electrode layer 162 directly contacts with the second conductivity type electrode 146 to form an electrical connection with the second conductivity type electrode 146. In addition, a protection layer 148 may be selectively formed to cover the side surface 140 and the bottom surface 136 of the trench 132 to prevent a short circuit from being occurred when the device is operated. Next, a reflective layer 150 is formed to cover the sidewall 134 and the side surface 138 of the trench 132 to reflect the light emitted by the device outwardly.

Then, an optical material layer 154, such as a spectrum-converted material layer or a light-scattering material layer, may be selectively formed to cover the optical structure 178. Subsequently, as shown in FIG. 3B, an encapsulant layer 156 is formed to fill the cavity 130 to protect the epitaxial structure 116 and to complete the manufacturing of a light-emitting diode 180.

According to the aforementioned embodiments of the present teachings, one advantage of the present teachings is that a growth substrate may be used to replace a package frame, so that the volume of a packaged structure of the light-emitting diode can be reduced and the manufacturing cost can be decreased.

According to the aforementioned embodiments of the present teachings, another advantage of the present teachings is that the conduction locations of two electrodes of the light-emitting diode with horizontal electrodes can be adjusted to the same side of a package structure, so that a wire bonding step can be omitted, and the light-emitting diode can be directly disposed on a circuit board. Therefore, the light-extracting area of the light-emitting diode device can be increased, and the problem of poor yield of wire bonding in the conventional design can be avoided.

According to the aforementioned embodiments of the present teachings, still another advantage of the present teachings is that a substrate replacement technique can be used to enhance the heat-dissipating efficiency, so that the life of the light-emitting diode and the stability of the photoelectric quality can be increased.

As is understood by a person skilled in the art, the foregoing exemplary embodiments of the present teachings are illustrative of the present teachings rather than limiting of the present teachings. It is intended to cover various modifications and similar arrangements included within the spirit and scope of the appended claims, the scope of which should be accorded the broadest interpretation so as to encompass all such modifications and similar structure.

What is claimed is:

1. A light-emitting diode, comprising:
   a bonding substrate comprising a first surface and a second surface on opposite sides;
   a first conductivity type electrode disposed on the second surface of the bonding substrate;
   a bonding layer disposed on the first surface of the bonding substrate;
   an epitaxial structure including a first conductivity type semiconductor layer, an active layer, and a second conductivity type semiconductor layer stacked on the bonding layer in sequence, wherein the first conductivity type semiconductor layer and the second conductivity type semiconductor layer have different conductivity types, and a trench is set around the epitaxial structure and extends from the second conductivity type semiconductor layer to the first conductivity type semiconductor layer;
   a second conductivity type electrode electrically connected to the second conductivity type semiconductor layer; and
   a growth substrate disposed on the epitaxial structure, wherein the growth substrate comprises a cavity exposing a portion of the epitaxial structure and the trench.

2. The light-emitting diode according to claim 1, wherein the bonding substrate comprises Si, Al, Cu, Mo, Ni, CuW, or a combination thereof.

3. The light-emitting diode according to claim 1, wherein the first conductivity type electrode comprises a eutectic metal or a noneutectic metal, and wherein the eutectic metal comprises AuSn, AgSn, AgSnCu, AuSnCu, AuBe, or a combination thereof, and the noneutectic metal comprises Au, Pt, Cr, Ti, Ni, Al, or a combination thereof.

4. The light-emitting diode according to claim 1, further comprising a first conductivity type contact layer between the bonding layer and the first conductivity type semiconductor layer.

5. The light-emitting diode according to claim 4, wherein the first conductivity type contact layer comprises a Ni/Au structure, a Ni/Ag structure, an ITO layer, a ZnO layer, a GZO layer, an AZO layer or an $InO_2$ layer.

6. The light-emitting diode according to claim 4, further comprising the first conductivity type contact layer between a reflective layer and the first conductivity type semiconductor layer.

7. The light-emitting diode according to claim 1, wherein the epitaxial structure is made of a material comprising an InAlGaN-based material or an InAlGaP-based material.

8. The light-emitting diode according to claim 1, wherein the epitaxial structure further comprises:
   an undoped semiconductor layer disposed on the second conductivity type semiconductor layer; and
   a buffer layer disposed between the growth substrate and the undoped semiconductor layer.

9. The light-emitting diode according to claim 1, wherein the second conductivity type electrode is disposed on the second conductivity type semiconductor layer, and the cavity exposes the second conductivity type electrode.

10. The light-emitting diode according to claim 9, further comprising a protection layer, wherein the protection layer covers a portion of the second conductivity type electrode, the exposed portion of the epitaxial structure, and a side surface and a bottom surface of the trench.

11. The light-emitting diode according to claim 1, further comprising a contact hole, wherein the contact hole extends from the first conductivity type semiconductor layer to the second conductivity type semiconductor layer, and wherein the contact hole exposes a portion of the second conductivity type semiconductor layer.

12. The light-emitting diode according to claim 11, wherein the second conductivity type electrode is disposed on the portion of the second conductivity type semiconductor layer.

13. The light-emitting diode according to claim 12, further comprising:
   an insulation layer covering a portion of the second conductivity type electrode and a bottom surface and a side surface of the contact hole; and
   a second conductivity type metal electrode layer filling up the contact hole.

14. The light-emitting diode according to claim 13, further comprising a protection layer, wherein the protection layer covers the exposed portion of the epitaxial structure, and a side surface and a bottom surface of the trench.

15. The light-emitting diode according to claim 14, further comprising an optical structure disposed on the portion of the epitaxial structure, wherein the optical structure is a part of the growth substrate.

16. The light-emitting diode according to claim 11, wherein a depth of the contact hole is between about 10 μm and about 400 μm.

17. The light-emitting diode according to claim 1, wherein the growth substrate comprises $Al_2O_3$, SiC, or GaAs.

18. The light-emitting diode according to claim 1, wherein the growth substrate comprises a sidewall, and wherein a thickness of the sidewall of the growth substrate is between about 1 μm and about 200 μm.

19. The light-emitting diode according to claim 1, wherein the growth substrate comprises a sidewall, and wherein the light-emitting diode further comprises a reflective layer extending on the sidewall and a side surface of the trench.

20. The light-emitting diode according to claim 1, further comprising
   a spectrum-converted material layer or a light-scattering material layer covering the exposed portion of the epitaxial structure; and
   an encapsulant layer disposed in the cavity.

* * * * *